United States Patent [19]
Mizutani

[11] Patent Number: 5,703,899
[45] Date of Patent: Dec. 30, 1997

[54] GAIN-COUPLING DISTRIBUTED FEEDBACK SEMICONDUCTOR AND METHOD OF PRODUCING THE SAME

[75] Inventor: Natsuhiko Mizutani, Yokohama, Japan

[73] Assignee: Canon Kabushiki Kaisha, Tokyo, Japan

[21] Appl. No.: 659,114

[22] Filed: Jun. 3, 1996

Related U.S. Application Data

[63] Continuation of Ser. No. 200,509, Feb. 24, 1994, abandoned.

[30] Foreign Application Priority Data

Mar. 1, 1993 [JP] Japan .................... 5-064762

[51] Int. Cl.⁶ .................................... H01S 3/08
[52] U.S. Cl. .................................... 372/96; 372/50
[58] Field of Search ............... 372/45, 46, 50, 372/96

[56] References Cited

FOREIGN PATENT DOCUMENTS 0582986  2/1994  European Pat. Off. .

OTHER PUBLICATIONS

English translation of Japanese Patent Application Laid-Open, No. 6241978, Oct. 7, 1988, for "Distributed Feedback Semiconductor Laser", filed Mar. 27, 1987.

Nakano et al., "Facet Reflection Independent, Single Longitudinal Mode Oscillation in a GaAlAs/GaAs Distribution Feedback Laser Equipped with a Gain-Coupling Mechanism," App. Phys. Lett., 55:1606 Oct. (1989).

Luo et al., "Fabrication and Characteristics of Gain-Coupled Distribution Feedback Semiconductor Lasers with a Corrugated Active Layer," IEEE J. Quantum Elec., 27:1724 Jun. (1991).

Primary Examiner—Rodney B. Bovernick
Assistant Examiner—Robert E. Wise
Attorney, Agent, or Firm—Fitzpatrick, Cella, Harper & Scinto

[57] ABSTRACT

There is a phenomenon that, when an epitaxial growth is performed on an uneven surface, such as a periodical surface or grating surface, having surfaces with different surface indices, p- and n-type layer portions can be simultaneously formed depending on growth surface orientations if an impurity such as Si or group IV elements is used. In a gain-coupling distributed feedback laser of the present invention, that phenomenon is utilized, and a current restraint layer, which includes alternately-arranged p- and n-type layer portions, is formed in the vicinity of an active layer. Thus, current is unevenly injected into the active layer, and a periodical gain structure can be established. As a result, a distributed feedback structure is achieved, which performs a gain-coupling operation.

48 Claims, 7 Drawing Sheets

GAIN-COUPLING DISTRIBUTED FEEDBACK SEMICONDUCTOR AND METHOD OF PRODUCING THE SAME

This application is a continuation of application No. 08/200,509 filed Feb. 24, 1994, now abandoned.

BACKGROUND OF THE INVENTION

1. Field of the Invention

The present invention relates to a single-mode oscillation distributed feedback semiconductor laser, and in particular, to a gain-coupling distributed feedback semiconductor laser, which operates in a single mode due to a gain coupling, and a method of producing the gain-coupling distributed feedback semiconductor laser.

2. Related Background Art

A distributed feedback laser is conventionally known as a single-mode oscillation laser. In a Bragg waveguide whose equivalent refractive index is modulated at a periodicity or pitch $\Lambda$, advancing and retreating waves of light having a wavelength in the vicinity of a Bragg wavelength are coupled to each other and reflected. When a gain exists in the waveguide, a laser oscillation occurs in the laser. However, its oscillation wavelength is not the Bragg wavelength, and the single-mode oscillation is effected at an outside end of a stop band in a longitudinal mode.

In order to achieve a stabler single-mode operation, a method is known, according to which a structure for shifting a phase of a grating is formed at a central portion of the laser to oscillate a mode of the Bragg condition wavelength. The amount of the phase shift is in most cases set at a quarter of the Bragg wavelength, but a complicated step is needed to fabricate the phase-shift diffraction grating.

Further, the above-discussed refractive index-coupling distributed feedback laser has an inherent problem: The single-mode operation of the distributed feedback laser is likely to be affected by a spatial hole burning and an end-surface reflection as well as returning light. Moreover, such a laser is subject to a chirping at a high-speed modulation time, and thus its line-width increases.

A gain-coupling distributed feedback laser is proposed to solve those problems. Features of the gain-coupling distributed feedback laser are as follows: A single-mode operation under a Bragg condition is possible without using a phase-shift structure. Adverse influence of returning light is small in the gain-coupling type, as compared to the index-coupling type. The amount of chirping is small in the gain-coupling type. Decrease in yield due to a phase position of its facet plane does not exist in the gain-coupling type.

For example, a structure, in which an absorptive body is periodically formed on an active layer to impart a periodical absorption loss and thus achieving a gain-coupling operation, is disclosed in "Applied Physics Letters", vol. 55, No. 16, pp. 1606–1608.

The above-mentioned gain-coupling distributed feedback laser, however, has the drawback that an oscillation threshold increases due to an increase in its internal loss. Furthermore, "IEEE Journal of Quantum Electronics", vol. 27, No. 6, pp. 1724–1731 discloses a gain-coupling distributed feedback laser which is fabricated by regrowing the buffer layer and the active layer on a second-order diffraction grating of the AlGaAs series. This structure, however, has disadvantages. Reduction of its threshold current is not easy because of a regrown interface in the vicinity of the active layer and adoption of a quantum well structure in the active layer is difficult.

SUMMARY OF THE INVENTION

It is an object of the present invention to provide a gain-coupling distributed feedback laser which operates in a single mode due to gain-coupling. The gain-coupling distributed feedback laser can be readily fabricated and its recombination current at a regrown interface can be reduced since the regrown interface can be positioned away from its active layer. Further, its freedom in design can be increased since a quantum well structure can be employed as the active layer.

Further, it is an object of the present invention to provide a method of fabricating a gain-coupling distributed feedback laser.

The object of the present invention is achieved by a gain-coupling distributed feedback semiconductor laser which performs a gain-coupling distributed feedback operation by a structure which comprises a waveguide including an active layer, and a current restraint layer formed along the waveguide. The current restraint layer includes p- and n-type semiconductor portions which are periodically arranged alternately along a light propagation direction.

Further, the object of the present invention is achieved by a method of fabricating a gain-coupling distributed feedback semiconductor laser which performs a gain-coupling distributed feedback operation, which comprises a step of forming an uneven surface having a plurality of kinds of surfaces with different surface indices, and a step of forming a current restraint layer on the uneven surface by simultaneously forming p- and n-type semiconductor portions on the uneven surface using a gas-phase crystal growth method.

More specifically, the p- and n-type semiconductor portions may be arranged at a pitch which is equal to ½×(natural number)×(a wavelength of light propagating along said waveguide). The p- and n-type semiconductor portions may be respectively Si-doped semiconductor layers grown on layer portions having different surface orientations. The active layer may comprise a multi-quantum well structure. Light confinement layers may be respectively formed under and above the active layer. A carrier block layer may be formed on the light confinement layer. A light guide layer may be formed on the carrier block layer. The current restraint layer may be formed on the carrier block layer. The current restraint layer may be formed on the light guide layer. The current restraint layer may be grown on an uneven surface. The uneven surface may comprise a periodical (or, periodic) uneven surface whose pitch is equal to a pitch of modulation of carrier density of current injected into the current restraint layer. The uneven surface may comprise a periodical uneven surface whose pitch is equal to half of a pitch of modulation of carrier density of current injected into the current restraint layer. The uneven surface may have a triangular sectional shape. The uneven surface may have a trapezoidal sectional shape. The uneven surface may have an asymmetric sectional shape.

The vapor-phase crystal growth method may be one of molecular beam epitaxy (MBE), chemical beam epitaxy (CBE), metal organic molecular beam epitaxy (MOMBE), and gas source molecular beam epitaxy (GSMBE) methods, and an amphi-conductivity impurity of group IV may be used as an impurity. The vapor-phase crystal growth method may be metal organic vapor phase epitaxy (MOVPE) method, and an amphi-conductivity impurity of group IV may be used as an impurity. The uneven surface may be formed using wet etching with sulphuric acid series etchant. The uneven surface may be formed using light wet etching with sulphuric acid series etchant that is performed after dry etching.

DESCRIPTION OF THE PREFERRED EMBODIMENTS

First Embodiment

Embodiments of the present invention will be hereinafter described with reference to the figures.

A first embodiment of the present invention will be described with reference to FIGS. 1A–1D.

Figure 1A:
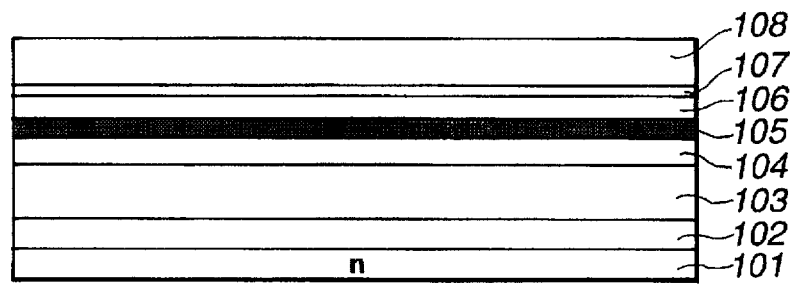
FIGS. 1A–1C are respectively cross-sectional views illustrating steps for fabricating a first embodiment of the present invention which is directed to a single-mode distributed feedback laser having a buried heterostructure.

As shown in FIG. 1A, an n-GaAs buffer layer 102 having a thickness of 0.5 μm is initially formed on a Si-doped n-GaAs (001) substrate 101, and a Si-doped $Al_{0.5}Ga_{0.5}As$ cladding layer 103 having a thickness of 1.5 μm is formed on the buffer layer 102. Then, a Si-doped $Al_{0.3}Ga_{0.7}As$ layer 104 of a light confinement region having a thickness of 100 nm is layered, and an active layer 105 of a multi-quantum well is formed on the Si-doped layer 104. The multi-quantum well layer 105 is composed of five undoped $Al_{0.3}Ga_{0.7}As$ barrier layers each having a thickness of 10 nm and five undoped GaAs well layers each having a thickness of 6 nm, which are alternately layered. Then, a Be-doped $Al_{0.3}Ga_{0.7}As$ layer 106 of an upper light confinement region having a thickness of 100 nm is layered, and a Be-doped $Al_{0.4}Ga_{0.6}As$ carrier block layer 107 having a thickness of 40nm on the Be-doped layer 106. Further, Be-doped $Al_{0.15}Ga_{0.85}As$ light guide layer 108 is formed on the carrier block layer 107. Thus, a first growth is completed.

Figure 1B:
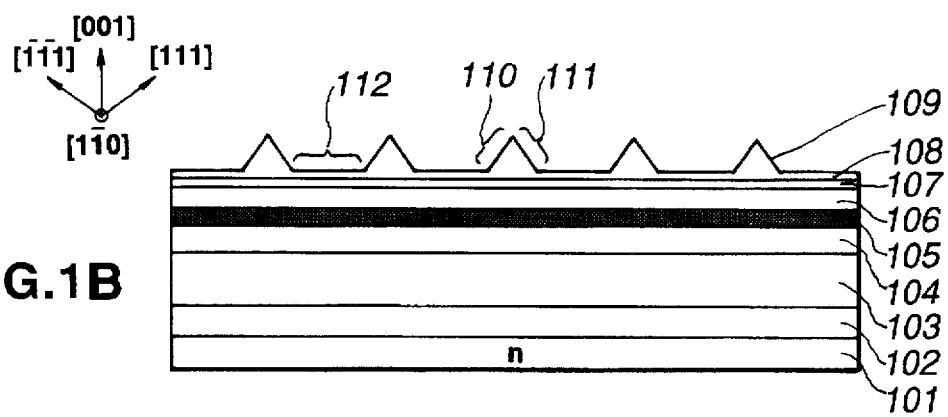

Next, as shown in FIG. 1B, a resist pattern having a pitch of 250 nm is formed on the carrier block layer 107 using a laser interference exposure method, and a grating 109 is formed by etching. The grating 109 is a second-order diffraction grating for an AlGaAs series laser having an oscillation wavelength of approximately 830 nm. The direction of grooves of the grating 109 is aligned to a direction of [1$\bar{1}$0]. By using wet etching with an etchant of sulphuric acid series or light wet etching with an etchant of sulphuric acid series, which is performed after dry etching, slanting portions of (111)A surfaces 110 and 111 and flat portions of (001) surfaces 112 are formed as shown in FIG. 1B.

Figure 1C:
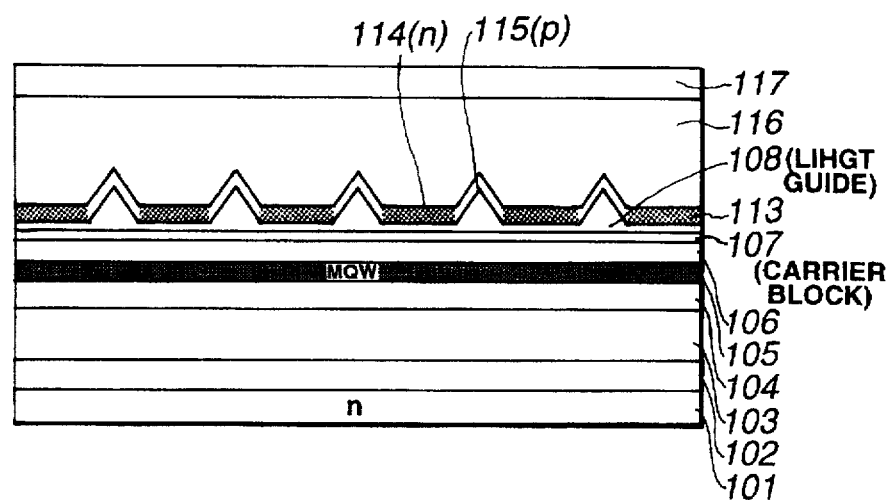

After remaining resist and oxide on the surface are removed by thermal cleaning and electron cyclotron resonance (ECR) hydrogen plasma process performed in an MBE chamber, an Si-doped $Al_{0.5}Ga_{0.85}As$ layer having a thickness of 0.2 μm is grown on the surface by using organic metal and arsine ($AsH_3$) as material and a solid Si as a dopant, using the chemical beam epitaxy (CBE) method. Thus, a current restraint layer 113 is formed as shown FIG. 1C. When the growth conditions are appropriately selected, conduction types of the Si-doped AlGaAs layers differ from each other, depending on the surface orientation of the underlying layer on which those Si-doped AlGaAs layers are grown. That is, an n-type layer 114 appears on a (100) surface and a p-type layer 115 appears on a (111)A surface, so n- and p-type AlGaAs layers 114 and 115 can be alternately arranged at the same pitch as that of the diffraction grating 109, as shown in FIG. 1C. Then a Be-doped $Al_{0.5}Ga_{0.5}As$ cladding layer 116 having a thickness of 1.5 μm is formed on the n- and p-type AlGaAs layers 114 and 115, and a Be-doped GaAs cap layer 117 having a thickness of 0.5 μm is deposited on the cladding layer 116.

Figure 2:
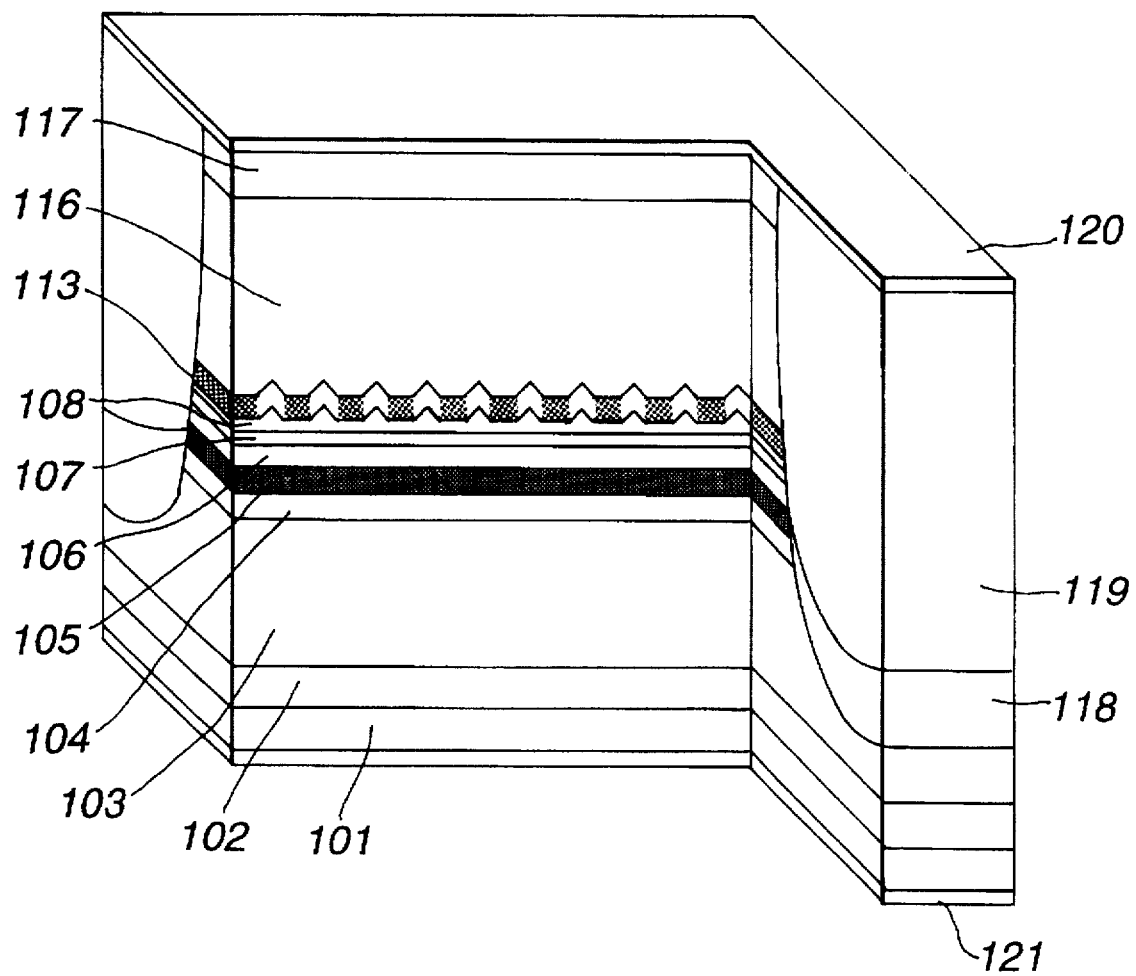
FIG. 2 is a partially cut-away perspective view illustrating the first embodiment.

Further, as shown in FIG. 2, a stripe is formed by etching, using an ordinary photolithography method, and a p-$Al_{0.4}Ga_{0.5}As$ 118 and an n-$Al_{0.4}Ga_{0.6}As$ 119 are buried at side portions. Then, an upper p-side electrode 120 and a lower n-side electrode 121 are formed, and a transverse single mode is realized by confinement in a transverse direction.

The operation of this embodiment will be described below. When current is injected, the p-type portions 115 of the current restraint layer 113 serve as a path of current, while the n-type portions 114 thereof act as a current block portion. Further, a curve of potential at p-n junction portions slightly curve potentials of the upper light guide layer 108 and the active layer 105, so that holes injected into the active layers 105 are weakly confined by a potential difference though spread by diffusion. Therefore, the holes are unevenly injected into the active layer 105, and a density distribution of holes is periodically modulated.

Figure 1D:
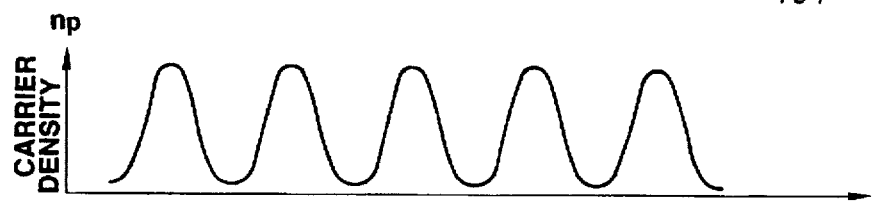
FIG. 1D is a graph illustrating a carrier density distribution in an active layer of the first embodiment.

The carrier density distribution in the active layer 105 is shown in FIG. 1D. The gain and equivalent refractive index of the active layer 105 are modulated due to the carrier density distribution. Furthermore, physical unevenness at an interface between current restraint layer 113 and cladding layer 116 causes modulation of the equivalent refractive index in the waveguide. Although a difference in conduction type in the current restraint layer 113 results in a difference in the refractive index, this difference is small, compared to the modulation amount of the refractive index due to the structural modulation. Thus, a Bragg waveguide is established by these structural features and uneven current injection, and a stable oscillation in a single longitudinal mode is attained.

In the first embodiment, when a device length is set to 500 μm and a mesa width is set to 2 μm, the oscillation threshold value is approximately 10 mA and a single-mode oscillation is performed at a wavelength 835 nm. In this embodiment, recombination at the regrown interface is prevented by the carrier block layer 107, and this fact contributes to reduction of the threshold.

Figure 3:
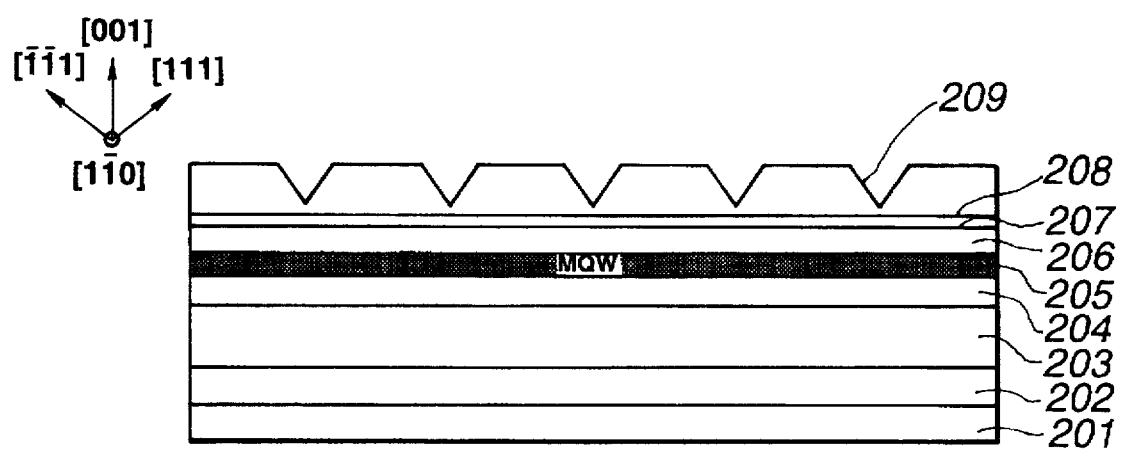
FIG. 3 is a cross-sectional view illustrating a modification of a diffraction grating formed on a light guide layer.

Although the buried heterostructure is used as a transverse confinement structure in the first embodiment, other conventional carrier confinement type waveguide structures may be employed if they are applicable to a laser having an active layer of a quantum well structure. Further, the shape of the second-order diffraction grating 109 is not limited to a triangular shape shown in FIG. 1B, but a trapesoidal shape as shown in FIG. 3 may be adopted, for example, only if different crystalline surfaces, on which n-AlGaAs and p-AlGaAs can be simultaneously grown, are exposed. In FIG. 3, portions corresponding to the portions in FIG. 1B are designated by reference numerals which are respectively created by adding a hundred to the reference numerals in FIG. 1B.

Second Embodiment

Figure 4A:
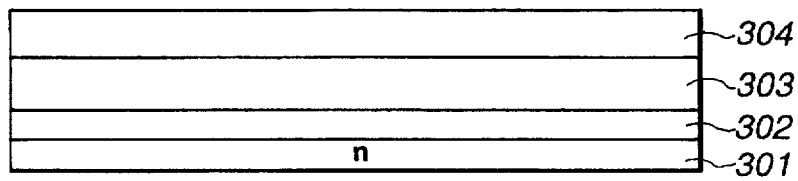
FIGS. 4A–4C are respectively cross-sectional views illustrating steps for fabricating a second embodiment of the present invention which is directed to a single-mode distributed feedback laser having a buried heterostructure.
Figure 4B:
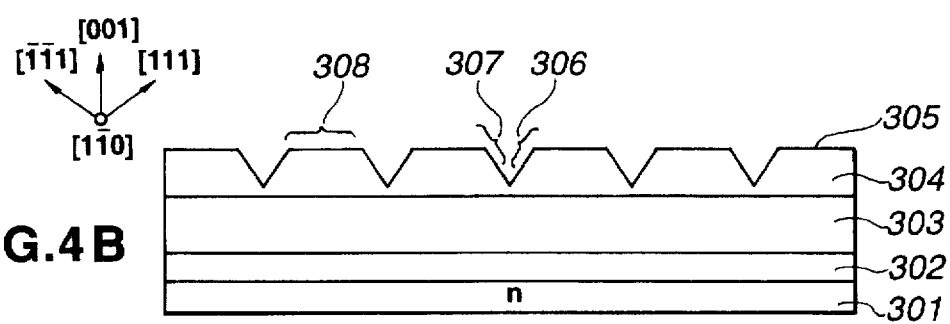
Figure 4C:
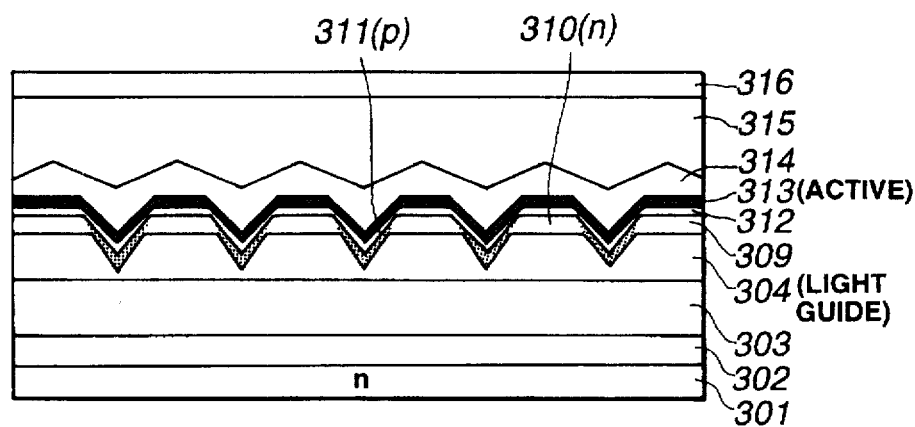

FIGS. 4A–4C show a second embodiment of the present invention, which relates to a gain-coupling distributed feedback semiconductor laser having a structure wherein a current restraint layer is formed under an active layer. Detailed structure and fabrication methods of the second embodiment are described below.

As shown in FIG. 4A, an n-GaAs buffer layer 302 having a thickness of 0.5 μm is initially formed on a Si-doped n-GaAs (001) substrate 301, and a Si-doped $Al_{0.5}Ga_{0.5}As$ cladding layer 303 having a thickness of 1.5 μm is formed on the buffer layer 302. Then, a Si-doped $Al_{0.2}Ga_{0.8}As$ light guide layer 304 having a thickness of 100 nm is layered.

Next, as shown in FIG. 4B, a resist pattern having a pitch of 250 nm is formed on the light guide layer 304 using a laser interference exposure method, and a second-order grating 305 is formed by etching. The direction of grooves of the grating 305 is aligned to a direction of $[1\bar{1}0]$. By using wet etching with an etchant of sulphuric acid series or light wet etching with an etchant of sulphuric acid series, which is performed after dry etching, slanting portions of (111)A surfaces 306 and 307 and flat portions of (001) surfaces 308 are formed as shown in FIG. 4B, similar to the first embodiment.

After remaining resist and oxide on the surface are removed by thermal cleaning and electron cyclotron resonance (ECR) hydrogen plasma process in an MBE chamber, a Si-doped $Al_{0.2}Ga_{0.8}As$ layer having a thickness of 0.2 μm is grown on the surface, using the MBE method. Thus, a current restraint layer 309 is formed as shown in FIG. 4C. When the growth conditions are appropriately selected, conduction types of the Si-doped AlGaAs layers differ from each other, depending on surface orientations of the underlying layer on which those Si-doped AlGaAs layers are grown. That is, an n-type conductive layer 310 appears on a (001) surface and a p-type block layer 311 appears on a (111)A surface.

Then, a Sn-doped $Al_{0.2}Ga_{0.8}As$ layer 312 having a thickness of 0.2 μm, which is a lower light confinement region, is formed on the p- and n-type AlGaAs layers 311 and 310, and an undoped GaAs active layer 313 having a thickness of 0.1 μm is formed on the Sn-doped layer 312. Further, a Be-doped $Al_{0.2}Ga_{0.8}As$ layer 314 having a thickness of 100 nm, which is an upper light confinement region, is formed on the active layer 313, and a Be-doped $Al_{0.5}Ga_{0.5}As$ cladding layer 315 having a thickness of 1.5 μm is formed. On the cladding layer 315, a Be-doped GaAs cap layer 316 having a thickness of 0.5 μm is formed as shown in FIG. 4C.

Since the Sn-doped AlGaAs layer 312 becomes an n-type layer, independent of the surface orientation, the conduction type of the lower light confinement layer 312 is an n-type in its entirety.

Furthermore, on this wafer, a waveguide structure in a transverse direction, a carrier confinement structure, an upper p-side electrode and a lower n-side electrode are formed, and a single-mode laser is realized, similar to the first embodiment.

In the second embodiment, the p-type layer becomes the carrier block layer 311 and performs a current restraint for injected current. Further, since the active layer 313 is unevenly formed, the modulation of the refractive index-coupling coefficient is increased, compared to the first embodiment. The single-mode operation is thus accomplished, similar to the first embodiment.

Third Embodiment

A third embodiment of the present invention will be described with reference to FIGS. 5A–5D. The third embodiment relates to a distributed feedback semiconductor laser in which a first-order coupling is conducted in an AlGaAs series semiconductor laser. Detailed structure and fabrication methods of the third embodiment will be described in the following.

Figure 5A:
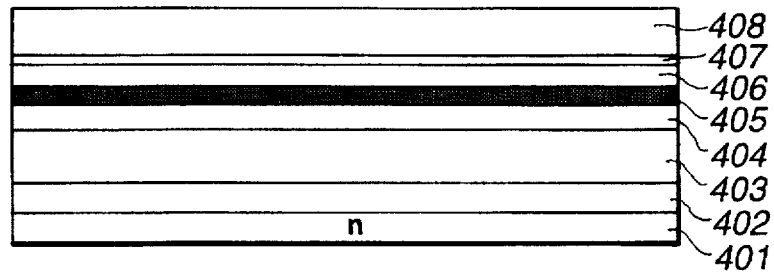
FIGS. 5A–5C are respectively cross-sectional views illustrating steps for fabricating a third embodiment of the present invention which is directed to a single-mode distributed feedback laser having a buried heterostructure.

As shown in FIG. 5A, an n-GaAs buffer layer 402 having a thickness of 0.5 μm is initially formed on a Si-doped n-GaAs (001) substrate 401, and a Si-doped $Al_{0.5}Ga_{0.5}As$ cladding layer 403 having a thickness of 1.5 μm is formed on the buffer layer 402. Then, a Si-doped $Al_{0.3}Ga_{0.7}As$ layer 404 of a light confinement region having a thickness of 100 nm is layered, and an active layer 405 of a multi-quantum well structure is formed on the Si-doped layer 404. The multi-quantum well active layer 405 is composed of five undoped $Al_{0.3}Ga_{0.7}As$ barrier layers each having a thickness of 10 nm and five undoped GaAs well layers each having a thickness of 6 nm, which are alternately layered. Then, a Be-doped $Al_{0.3}Ga_{0.7}As$ layer 406 of an upper light confinement region having a thickness of 100 nm is layered, and a Be-doped $Al_{0.4}Ga_{0.6}As$ carrier block layer 407 having a thickness of 40 nm is formed on the Be-doped layer 406. Further, a Be-doped $Al_{0.15}Ga_{0.85}As$ light guide layer 408 is formed on the carrier block layer 407. Thus, a first growth is completed.

Figure 5B:
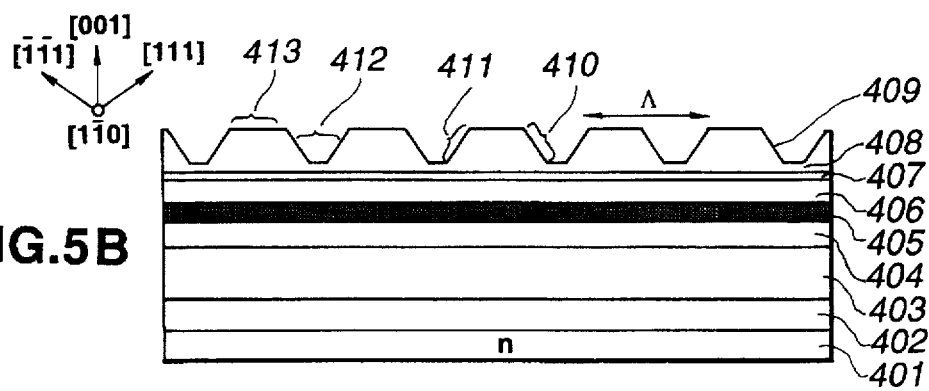

Next, as shown in FIG. 5B, a resist pattern having a pitch of 250 nm is formed on the light guide layer 408 using a laser interference exposure method, and a second-order grating 409 is formed by etching. The direction of grooves of the grating 409 is aligned to a direction of $[1\bar{1}0]$. By using light wet etching with an etchant of sulphuric acid series, which is performed after dry etching, slanting portions of (111)A surfaces 410 and 411 and flat portions of (001) surfaces 412 and 413 are formed as shown in FIG. 5B, and thus the grating 409 having a trapezoidal sectional shape is formed. Considering the effect of carrier diffusion, the etching condition is controlled so that the upper flat portion 413 is wider than the lower flat portion 412.

After remaining resist and oxide on the surface are removed by thermal cleaning and plasma process in an MBE chamber, a Si-doped $Al_{0.2}Ga_{0.8}As$ layer having a thickness of 0.2 μm is grown on the surface by using organic metal and arsine ($AsH_3$) as material, employing the CBE method. Thus, a current restraint layer 414 is formed.

Figure 5C:
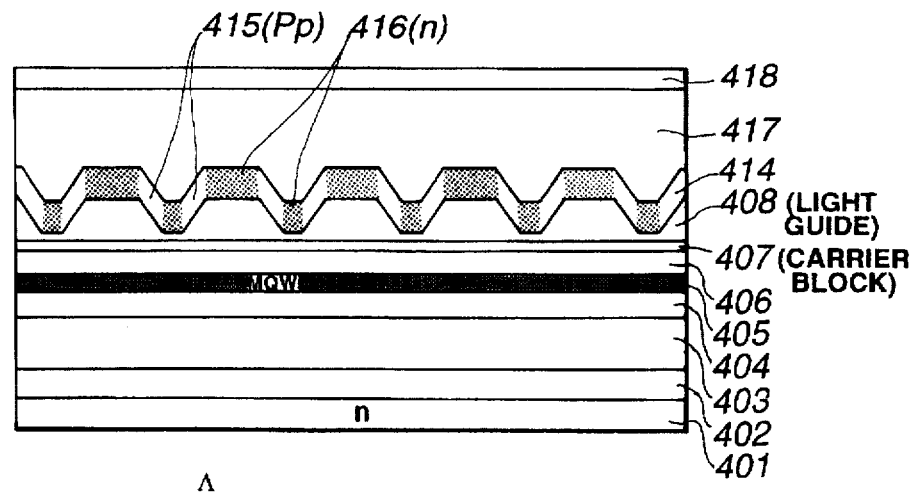
Figure 5D:
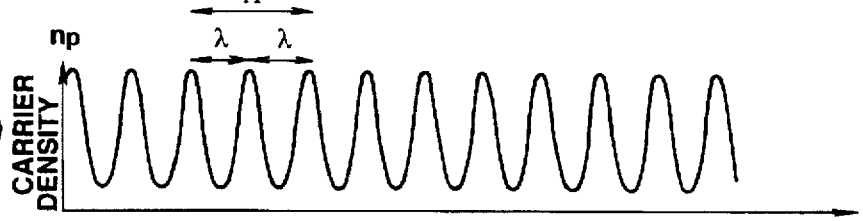
FIG. 5D is a graph illustrating a carrier density distribution in an active layer of the third embodiment.

Different conduction types appear depending on surface orientations of the underlying layer, and p- and n-type AlGaAs layers 415 and 416 can be alternately arranged as shown in FIG. 5C, similar to the first embodiment. However, as shown in FIG. 5D, a modulation pitch λ of carrier density at the time of current injection is a half of a pitch Λ of the diffraction grating 409. This is a main feature of the third embodiment.

Further, a Be-doped $Al_{0.5}Ga_{0.5}As$ cladding layer 417 having a thickness of $1.5$ μm is formed. On the cladding layer 417, a Be-doped GaAs cap layer 418 having a thickness of 0.5 μm is formed. Furthermore, on this wafer, a waveguide structure in a transverse direction, a carrier confinement structure, an upper p-side electrode and a lower n-side electrode are formed, and a single mode laser is attained, similar to the first embodiment.

Fourth Embodiment

Figure 6A:
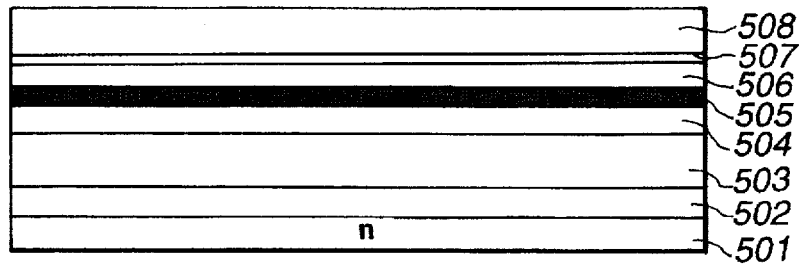
FIGS. 6A–6C are respectively cross-sectional views illustrating steps for fabricating a fourth embodiment of the present invention which is directed to a single-mode distributed feedback laser having a buried heterostructure.
Figure 6B:
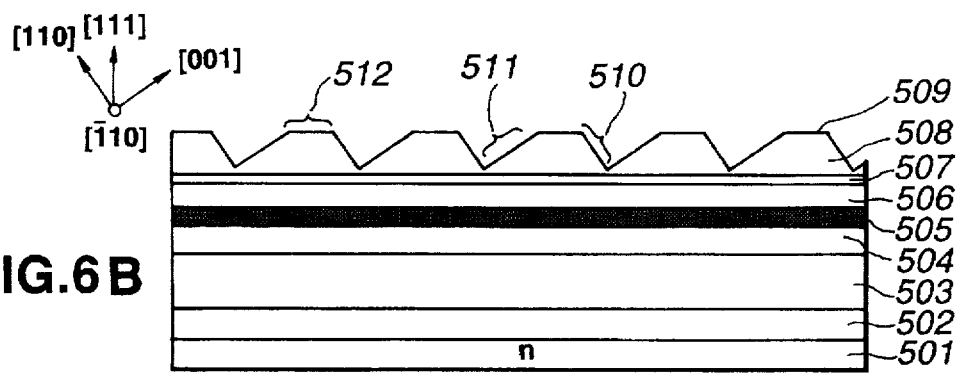
Figure 6C:
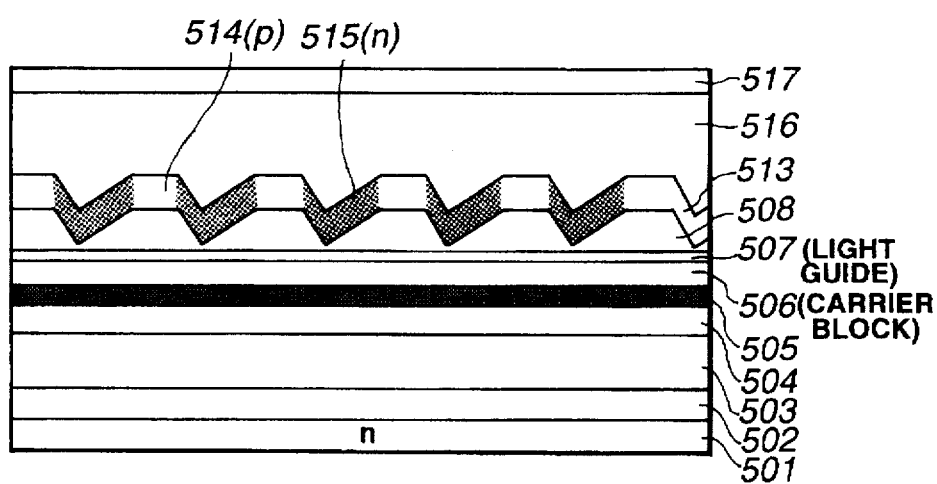

FIGS. 6A–6C shows a fourth embodiment of the present invention, which relates to a distributed feedback semiconductor laser which is obtained by applying the present invention to an AlGaAs series semiconductor laser using a (111)A substrate. Detailed structure and fabrication methods of the fourth embodiment are described in the following.

As shown in FIG. 6A, an n-GaAs buffer layer 502 having a thickness of 0.5 μm is initially formed on a Si-doped n-GaAs (001) substrate 501, and a Si-doped $Al_{0.5}Ga_{0.5}As$ cladding layer 503 having a thickness of 1.5 μm is formed on the buffer layer 502. Then, a Si-doped $Al_{0.3}Ga_{0.7}As$ layer 504 of a light confinement region having a thickness of 100 nm is layered, and an active layer 505 of a multi-quantum well structure is formed on the Si-doped layer 504. The multi-quantum well active layer 505 is composed of five undoped $Al_{0.3}Ga_{0.7}As$ barrier layers each having a thickness of 10 nm and five undoped GaAs well layers each having a thickness of 6 nm, which are alternately layered. Then, a Be-doped $Al_{0.3}Ga_{0.7}As$ layer 506 of an upper light confinement region having a thickness of 100 nm is layered, and a Be-doped $Al_{0.4}Ga_{0.6}As$ carrier block layer 507 having a thickness of 40 nm is formed on the Be-doped layer 506. Further, a Be-doped $Al_{0.15}Ga_{0.85}As$ light guide layer 508 is formed on the carrier block layer 507. Thus, a first growth is completed.

Next, as shown in FIG. 6B, a resist pattern having a pitch of 250 nm is formed on the light guide layer 508 using a laser interference exposure method, and a second-order grating 509 is formed by etching. The direction of grooves of the grating 509 is aligned to a direction of $[1\bar{1}0]$. By using light wet etching with an etchant of sulphuric acid series, which is performed after dry etching, slanting portions of (001) surface 510, slanting portions of (110) surfaces 511 and flat portions of (111) surface 512 are formed as shown in FIG. 6B, and thus the grating 509 having an asymmetrical sectional shape is formed.

After remaining resist and oxide on the surface are removed by thermal cleaning and plasma process in an MBE chamber, a Si-doped $Al_{0.2}Ga_{0.8}As$ layer having a thickness of 0.2 μm is grown on the surface by using organic metal and arsine ($AsH_3$) as material, employing the CBE method. Thus, a current restraint layer 513 is formed.

Different conduction types appear depending on surface orientations of the underlying layer, and p- and n-type AlGaAs layers 514 and 515 can be alternately arranged as shown in FIG. 6C, similar to the first embodiment. Dissimilar to the first embodiment, the p-type layer 514 is formed on the flat portion and becomes a path of current. This is a main feature of the fourth embodiment.

Further, a Be-doped $Al_{0.5}Ga_{0.5}As$ cladding layer 516 having a thickness of 1.5 μm is formed. On the cladding layer 516, a Be-doped GaAs cap layer 517 having a thickness of 0.5 μm is formed. Furthermore, on this wafer, a waveguide structure in a transverse direction, a carrier confinement structure, an upper p-side electrode and a lower n-side electrode are formed, and a single mode laser is realized, similar to the first embodiment.

Fifth Embodiment

Figure 7A:
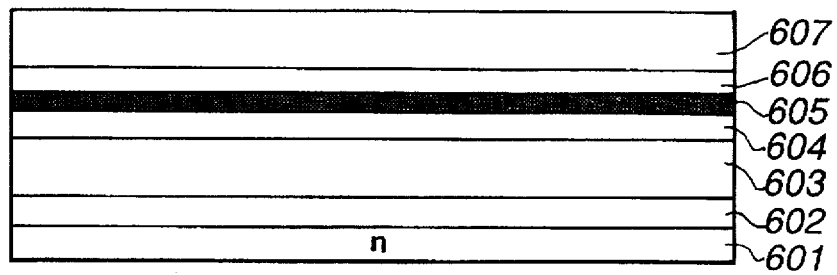
FIGS. 7A–7C are respectively cross-sectional views illustrating steps for fabricating a fifth embodiment of the present invention which is directed to a single-mode distributed feedback laser having a buried heterostructure.
Figure 7B:
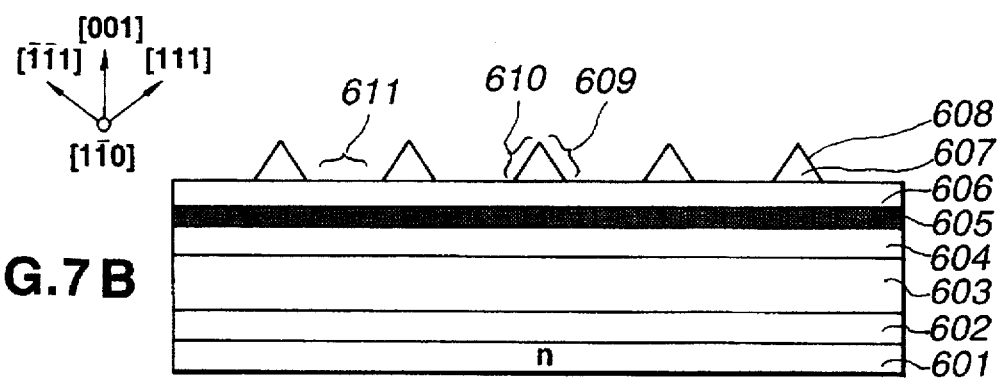
Figure 7C:
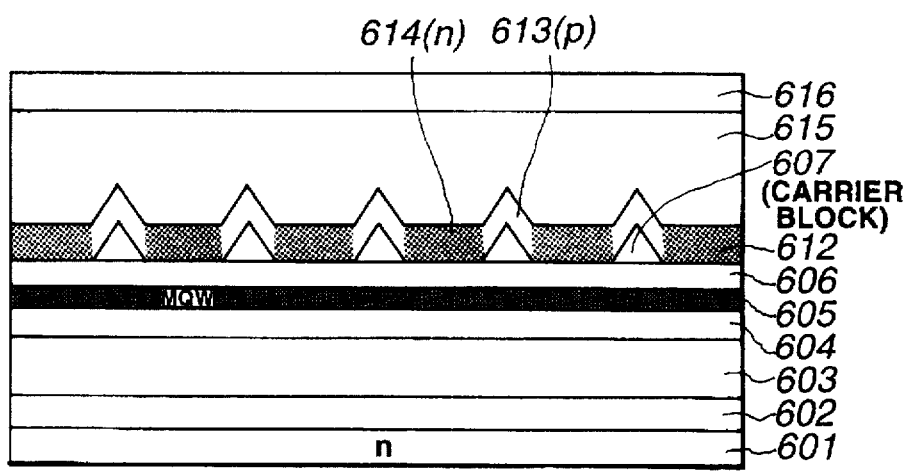

FIGS. 7A–7C shows a fifth embodiment of the present invention, which relates to another model of an AlGaAs series single-mode distributed feedback semiconductor laser. Detailed structure and fabrication methods of the fifth embodiment are described in the following.

As shown in FIG. 7A, an n-GaAs buffer layer 602 having a thickness of 0.5 μm is initially formed on a Si-doped n-GaAs (001) substrate 601, and a Si-doped $Al_{0.5}Ga_{0.5}As$ cladding layer 603 having a thickness of 1.5 μm is formed on the buffer layer 602. Then, a Si-doped $Al_{0.3}Ga_{0.7}As$ layer 604 of a light confinement region having a thickness of 100 nm is layered, and an active layer 605 of a multi-quantum well is formed on the Si-doped layer 604. The multi-quantum well active layer 605 is composed of five undoped $Al_{0.3}Ga_{0.7}As$ barrier layers each having a thickness of 10 nm and five undoped GaAs well layers each having a thickness of 6 nm, which are alternately layered. Then, a Be-doped $Al_{0.3}Ga_{0.7}As$ layer 606 of an upper light confinement region having a thickness of 100 nm is layered, and a Be-doped $Al_{0.4}Ga_{0.6}As$ carrier block layer 607 having a thickness of 120 nm is formed on the Be-doped layer 606. Thus, a first growth is completed.

Next, as shown in FIG. 7B, a resist pattern having a pitch of 250 nm is formed on the carrier block layer 607 using a laser interference exposure method, and a second-order grating 608 is formed by etching. The direction of grooves of the grating 608 is aligned to a direction of $[1\bar{1}0]$. By using wet etching with an etchant of sulphuric acid series, slanting portions of (111)A surfaces 609 and 610, and flat portions of (001) surface 611, which is an exposed surface of the upper light confinement layer 606, are formed as shown in FIG. 7B, and thus the grating 608 is formed. At this time, the etching rate varies depending on a difference between Al mole fractions of the light confinement layer 606 and the carrier block layer 607, so that the shaping of the grating 608 is very easy.

After remaining resist and oxide on the surface are removed by thermal cleaning and plasma process in an MBE chamber, a Si-doped $Al_{0.4}Ga_{0.6}As$ layer having a thickness of 0.2 μm is grown on the surface by using organic metal and arsine ($AsH_3$) as material, using the CBE method. Thus, a current restraint layer 612 is formed.

Different conduction types appear depending on surface orientations of the underlying layer, and p-type AlGaAs current injection portion 613 and n-type AlGaAs current block layer 614 can be alternately arranged as shown in FIG. 7C, similar to the first embodiment. However, recombination at the regrown interface is prevented by the following mechanism. In the current injection portion 613 formed by growing the p-type AlGaAs on the (111)A surfaces 609 and 610, current injection into the regrown interface is prevented by the action of the carrier block layer 607. In the current block portion 614 formed by growing the n-type AlGaAs on the upper light confinement region portion 606, recombination is diminished since a p-n junction is fabricated at the regrown interface and carriers are swept out by an internal electric field.

Further, a Be-doped $Al_{0.5}Ga_{0.5}As$ cladding layer 615 having a thickness of 1.5 μm is formed. On the cladding layer 615, a Be-doped GaAs cap layer 616 having a thickness of 0.5 μm is formed. Furthermore, on this wafer, a waveguide structure in a transverse direction, a carrier confinement structure, an upper p-side electrode and a lower n-side electrode are formed, similar to the first embodiment, and a single-mode laser is attained.

In the above-discussed embodiments, the crystalline growth on an n-GaAs substrate is used, and an AlGaAs series semiconductor laser is attained. However, a p-GaAs substrate may be used to fabricate a laser. In this case, block and current transmission portions of a current restraint layer are replaced with each other, but its structure and operation are substantially the same.

Furthermore, while only an AlGaAs series semiconductor laser is discussed in the foregoing, the present invention can be also applied to, for example, InGaAsP series laser, InAlGaP series laser, InGaAs series laser and InAlGaAs series laser since they are group III–V compound semiconductor lasers and those materials can be grown in a vapor phase using the MBE or MOMBE method.

Moreover, dopant impurity is not limited to Si, but any amphi-conductivity impurity of group IV, which creates p- or n-type layer depending on orientations of a growth surface, may be employed. Further, the MOVPE method and the like, which use group IV material as an impurity, may be used.

There is a phenomenon that, when epitaxial growth is performed on an uneven surface, such as a periodical surface or grating surface, having surfaces with different surface indices, p- and n-type layer portions can be formed depending on growth surface orientations if an impurity such as Si or group IV elements is used. In the present invention, that phenomenon is utilized, and a current restraint layer, which includes alternately-arranged p- and n-type layer portions, is formed in the vicinity of an active layer. Thus, current is unevenly injected into the active layer, and a periodical structure of gain can be established. As a result, a distributed feedback structure is achieved, which performs a gain-coupling operation. That is, the carrier density during current injection time is periodically modulated along a light propagation direction, and a periodical modulation is imparted to refractive index and gain in the waveguide due to the modulated carrier density. Thus, the waveguide becomes a Bragg waveguide, and a single-mode operation is attained by current above an oscillation threshold.

As described in the foregoing, according to the present invention, a gain-coupling distributed feedback laser, which operates in a single mode due to gain coupling, can be fabricated. Further, a laser, in which recombination current at a regrowth interface is small, can be realized since the regrowth interface can be formed away from an active layer. In addition, freedom in design is great because a quantum well structure can be employed in the active layer. In other words, a threshold can be decreased, an oscillation wavelength can be tuned by controlling parameters of the quantum well, an oscillation in a transverse magnetic (TM) mode can be oppressed, and an oscillation spectrum can be narrowed by introducing a strained structure.

While the present invention has been described with respect to what is presently considered to be the preferred embodiments, it is to be understood that the invention is not limited to the disclosed embodiments. The present invention is intended to cover various modifications and equivalent arrangements included within the sprit and scope of the following claims.

What is claimed is:

1. A gain-coupling distributed feedback semiconductor laser comprising:

a waveguide including an active layer; and a current restraint layer formed along said waveguide, said current restraint layer including p- and n-type semiconductor portions which are periodically and alternatively arranged along a light propagation direction;

wherein said current restraint layer is grown on a periodic uneven surface, wherein pitch of carrier density of current injected by said current restraint layer is equal to a value of one half of a pitch of the periodic uneven surface.

2. A gain-coupling distributed feedback semiconductor laser according to claim 1, wherein said p- and n-type semiconductor portions are alternately arranged at a pitch which is equal to ½×(natural number)×(a wavelength of light propagating along said waveguide).

3. A gain-coupling distributed feedback semiconductor laser according to claim 1, wherein said p- and n-type semiconductor portions are respectively amphi-conductuvity impurity-doped layers grown on layer portions having different surface orientations.

4. A gain-coupling distributed feedback semiconductor laser according to claim 3, wherein said amphi-conductivity impurity is Si.

5. A gain-coupling distributed feedback semiconductor laser according to claim 1, wherein said active layer comprises a multi-quantum well structure.

6. A gain-coupling distributed feedback semiconductor laser according to claim 1, wherein light confinement layers are respectively formed under and above said active layer.

7. A gain-coupling distributed feedback semiconductor laser according to claim 6, wherein a carrier block layer is formed on one of said light confinement layers.

8. A gain-coupling distributed feedback semiconductor laser according to claim 7, wherein a light guide layer is formed on said carrier block layer.

9. A gain-coupling distributed feedback semiconductor laser according to claim 8, wherein said current restraint layer is formed on said light guide layer.

10. A gain-coupling distributed feedback semiconductor laser according to claim 7, wherein said current restraint layer is formed on said carrier block layer.

11. A gain-coupling distributed feedback semiconductor laser according to claim 1, wherein said uneven surface has a trapezoidal sectional shape.

12. A gain-coupling distributed feedback semiconductor laser according to claim 1, wherein said uneven surface has an asymmetric sectional shape.

13. A method of fabricating a gain-coupling distributed feedback semiconductor laser, said method comprising the steps of:

forming a periodic uneven surface having a plurality of kinds of surfaces with different surface indices; and forming a current restraint layer on the uneven surface by simultaneously forming p- and n-type semiconductor portions on the uneven surface using a gas-phase crystal growth method.

14. A method of fabricating a gain-coupling distributed feedback semiconductor laser according to claim 13, wherein said gas-phase crystal growth method is one of molecular beam epitaxy, chemical beam epitaxy, metal organic molecular beam epitaxy, and gas source molecular beam epitaxy methods, and an amphi-conductivity impurity of group IV is used as an impurity.

15. A method of fabricating a gain-coupling distributed feedback semiconductor laser according to claim 13, wherein said gas-phase crystal growth method is the metal organic vapor phase epitaxy method, and an amphi-conductivity impurity of group IV is used as an impurity.

16. A gain-coupling distributed feedback semiconductor laser according to claim 13, wherein said p- and n-type semiconductor portions are alternately arranged at a pitch which is equal to ½×(natural number)×(a wavelength of light propagating along said waveguide).

17. A method of fabricating a gain-coupling distributed feedback semiconductor laser according to claim 13, wherein the p- and n-type semiconductor portions are respectively amphi-conductivity impurity-doped layers grown on the uneven surface.

18. A method of fabricating a gain-coupling distributed feedback semiconductor laser according to claim 17, wherein said amphiconductivity impurity is Si.

19. A method of fabricating a gain-coupling distributed feedback semiconductor laser according to claim 13, wherein the uneven surface has a trapezoidal sectional shape.

20. A method of fabricating a gain-coupling distributed feedback semiconductor laser according to claim 13, wherein the uneven surface has an asymmetric sectional shape.

21. A method of fabricating a gain-coupling distributed feedback semiconductor laser according to claim 13, wherein the uneven surface is formed using wet etching with sulphuric acid series etchant.

22. A method of fabricating a gain-coupling distributed feedback semiconductor laser according to claim 13, wherein the uneven surface is formed using light wet etching with sulphuric acid series etchant that is performed after dry etching.

23. A gain-coupling distributed feedback semiconductor laser comprising:
   a waveguide including an active layer; and
   a current restraint layer formed along said waveguide, said current restraint layer including p- and n-type semiconductor portions which are periodically and alternatively arranged along a light propagation direction;
   wherein said p- and n-type semiconductor portions are respectively amphi-conductivity impurity doped semiconductor layers grown on a periodic uneven surface.

24. A gain-coupling distributed feedback semiconductor laser according to claim 23, wherein said p- and n-type semiconductor portions are alternately arranged at a pitch which is equal to ½×(natural number)×(a wavelength of light propagating along said waveguide).

25. A gain-coupling distributed feedback semiconductor laser according to claim 23, wherein said amphiconductivity impurity is Si.

26. A gain-coupling distributed feedback semiconductor laser according to claim 23, wherein said active layer comprises a multi-quantum well structure.

27. A gain-coupling distributed feedback semiconductor laser according to claim 23, wherein light confinement layers are respectively formed under and above said active layer.

28. A gain-coupling distributed feedback semiconductor laser according to claim 27, wherein a carrier block layer is formed on one of said light confinement layers.

29. A gain-coupling distributed feedback semiconductor laser according to claim 28, wherein a light guide layer is formed on said carrier block layer.

30. A gain-coupling distributed feedback semiconductor laser according to claim 29, wherein said current restraint layer is formed on said light guide layer.

31. A gain-coupling distributed feedback semiconductor laser according to claim 28, wherein said current restraint layer is formed on said carrier block layer.

32. A gain-coupling distributed feedback semiconductor laser according to claim 23, wherein said a periodic uneven surface has a pitch equal to a pitch of modulation of carrier density of current injected into said current restraint layer.

33. A gain-coupling distributed feedback semiconductor laser according to claim 23, wherein said periodic uneven surface has a pitch equal to one half of a pitch of modulation of carrier density of current injected into said current restraint layer.

34. A gain-coupling distributed feedback semiconductor laser according to claim 23, wherein said uneven surface has a triangular sectional shape.

35. A gain-coupling distributed feedback semiconductor laser according to claim 23, wherein said uneven surface has a trapezoidal sectional shape.

36. A gain-coupling distributed feedback semiconductor laser according to claim 23, wherein said uneven surface has an asymmetric sectional shape.

37. A method of fabricating a gain-coupling distributed feedback semiconductor laser, said method comprising the steps of:
   forming a periodic uneven surface having a plurality of kinds of surfaces with different surface indices; and
   forming a current restraint layer on the uneven surface by simultaneously forming p- and n-type semiconductor portions on the uneven surface using a gas-phase crystal growth method;
   wherein a pitch of carrier density of current injected by said current restraint layer is equal to one half of a pitch of the periodic uneven surface.

38. A method of fabricating a gain-coupling distributed feedback semiconductor laser according to claim 37, wherein said gas-phase crystal growth method is one of molecular beam epitaxy, chemical beam epitaxy, metal organic molecular beam epitaxy, and gas source molecular beam epitaxy methods, and an amphi-conductivity impurity of group IV is used as an impurity.

39. A method of fabricating a gain-coupling distributed feedback semiconductor laser according to claim 37, wherein said gas-phase crystal growth method is a metal organic vapor phase epitaxy method, and an amphi-conductivity impurity of group IV is used as an impurity.

40. A method of fabricating a gain-coupling distributed feedback semiconductor laser according to claim 37, wherein said p- and n-type semiconductor portions are alternately arranged at a pitch which is equal to ½×) (natural number)×(a wavelength of light propagating along said waveguide).

41. A method of fabricating a gain-coupling distributed feedback semiconductor laser according to claim 37, wherein said amphiconductivity impurity is Si.

42. A method of fabricating a gain-coupling distributed feedback semiconductor laser according to claim 37, wherein the periodic uneven surface has a pitch equal to a pitch of modulation of carrier density of current injected into the current restraint layer.

43. A method of fabricating a gain-coupling distributed feedback semiconductor laser according to claim 37, wherein periodic uneven surface has a pitch equal to one half of a pitch of modulation of carrier density of current injected into the current restraint layer.

44. A method of fabricating a gain-coupling distributed feedback semiconductor laser according to claim 37, wherein the uneven surface has a triangular sectional shape.

45. A method of fabricating a gain-coupling distributed feedback semiconductor laser according to claim 37, wherein the uneven surface has a trapezoidal sectional shape.

46. A method of fabricating a gain-coupling distributed feedback semiconductor laser according to claim 37, wherein the uneven surface has an asymmetric sectional shape.

47. A method of fabricating a gain-coupling distributed feedback semiconductor laser according to claim 37, wherein the uneven surface is formed using wet etching with sulphuric acid series etchant.

48. A method of fabricating a gain-coupling distributed feedback semiconductor laser according to claim 37, wherein the uneven surface is formed using light wet etching with sulphuric acid series etchant that is performed after dry etching.

* * * * *

UNITED STATES PATENT AND TRADEMARK OFFICE
CERTIFICATE OF CORRECTION

PATENT NO. : 5,703,899

DATED : December 30, 1997

INVENTOR(S) : NATSUHIKO MIZUTANI

It is certified that error appears in the above-identified patent and that said Letters Patent is hereby corrected as shown below:

On the title page;

[56] REFERENCES CITED

Other Publications
"6241978" should read --63-241978--.

COLUMN 1

Line 35, "The" should read --the--.

COLUMN 2

Line 18, "fomed" should read --formed--.

COLUMN 4

Line 12, "Fig." should read --in Fig.--.
Line 28, "p-$Al_{0.4}Ga_{0.5}As$" should read --p-$Al_{0.4}Ga_{0.6}As$--.

COLUMN 11

Line 63, "a" should be deleted.

UNITED STATES PATENT AND TRADEMARK OFFICE
CERTIFICATE OF CORRECTION

PATENT NO. : 5,703,899

DATED : December 30, 1997

INVENTOR(S) : NATSUHIKO MIZUTANI

It is certified that error appears in the above-identified patent and that said Letters Patent is hereby corrected as shown below:

COLUMN 12

Line 39, "1/2x)" should read --1/2x--.
    Line 44, "amphiconductivity" should read
      --amphi-conductivity--.
    Line 51, "periodic" should read --said periodic--.

Signed and Sealed this

Twenty-fifth Day of August, 1998

Attest:

BRUCE LEHMAN

*Attesting Officer*      *Commissioner of Patents and Trademarks*